(12) United States Patent
Liu et al.

(10) Patent No.: US 12,362,000 B2
(45) Date of Patent: Jul. 15, 2025

(54) MEMORY DEVICE AND OPERATING METHOD THEREOF

(71) Applicants: TAIWAN SEMICONDUCTOR MANUFACTURING COMPANY, LTD., Hsinchu (TW); TSMC Nanjing Company Limited, Nanjing (CN)

(72) Inventors: Jun-Cheng Liu, Nanjing (CN); Zhi-Min Zhu, Nanjing (CN); Chien-Yu Huang, Taoyuan (TW); Ching-Wei Wu, Nantou County (TW)

(73) Assignees: Taiwan Semiconductor Manufacturing Company, Ltd., Hsinchu (TW); TSMC Nanjing Company Limited, Jiangsu Province (CN)

( * ) Notice: Subject to any disclaimer, the term of this patent is extended or adjusted under 35 U.S.C. 154(b) by 91 days.

(21) Appl. No.: 18/364,094

(22) Filed: Aug. 2, 2023

(65) Prior Publication Data
US 2025/0014631 A1    Jan. 9, 2025

(30) Foreign Application Priority Data
Jul. 7, 2023    (CN) .............................. 202321785271

(51) Int. Cl.
*G11C 11/4074* (2006.01)
*G11C 11/4094* (2006.01)
*G11C 11/4096* (2006.01)

(52) U.S. Cl.
CPC ...... *G11C 11/4074* (2013.01); *G11C 11/4094* (2013.01); *G11C 11/4096* (2013.01)

(58) Field of Classification Search
CPC .................................................. G11C 11/4074
See application file for complete search history.

(56) References Cited

U.S. PATENT DOCUMENTS

| 10,229,731 | B1 * | 3/2019 | Goel | G11C 11/419 |
| 12,243,585 | B1 * | 3/2025 | M Siddiqui | G11C 11/419 |
| 2014/0010027 | A1 * | 1/2014 | Fujiwara | G11C 7/12 |
| | | | | 365/189.09 |
| 2014/0169106 | A1 * | 6/2014 | Kolar | G11C 7/10 |
| | | | | 365/189.11 |

(Continued)

FOREIGN PATENT DOCUMENTS

TW    202230350 A    8/2022

*Primary Examiner* — Douglas King
(74) *Attorney, Agent, or Firm* — Birch, Stewart, Kolasch & Birch, LLP

(57) ABSTRACT

A memory device is provided, including at least one bit cell, a pair of transistors, and a voltage generation circuit. The voltage generation circuit is coupled to the negative voltage line and is configured to pull down a voltage of at least one of the pair of data lines to a negative voltage level through the negative voltage line. The voltage generation circuit includes a first capacitive unit, a second capacitive unit, and a switch circuit. The first capacitive unit includes a first capacitor. The second capacitive unit includes a second capacitor. The switch circuit is configured to connect the first capacitor, the second capacitor, or the combination thereof to the negative voltage line in response to a first kick signal and a second kick signal that are different from each other.

20 Claims, 8 Drawing Sheets

(56) References Cited

U.S. PATENT DOCUMENTS

| | | | |
|---|---|---|---|
| 2015/0076575 A1* | 3/2015 | Wu | H10D 1/66 |
| | | | 257/296 |
| 2015/0131364 A1* | 5/2015 | Hsieh | G11C 7/12 |
| | | | 365/189.09 |
| 2017/0004874 A1* | 1/2017 | Braceras | G11C 11/419 |
| 2017/0117034 A1* | 4/2017 | Hebig | G11C 11/419 |
| 2021/0201977 A1* | 7/2021 | Tsai | G11C 11/417 |
| 2023/0012567 A1 | 1/2023 | Rawat et al. | |
| 2023/0206983 A1 | 6/2023 | Shimomura et al. | |

* cited by examiner

MEMORY DEVICE AND OPERATING METHOD THEREOF

CROSS REFERENCE

The present application claims priority to China Application Serial Number 202321785271.3 filed on Jul. 7, 2023, which is herein incorporated by reference in its entirety.

BACKGROUND

In static random access memory (SRAM) design, high-density bit cells usually adopt negative bit line (NBL) scheme to improve write capability. The traditional way of achieving NBL scheme is to couple two capacitors to a voltage line. This will cause the voltage line to have a large capacitance, decrease a kick efficiency of the NBL scheme, and lead to more power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
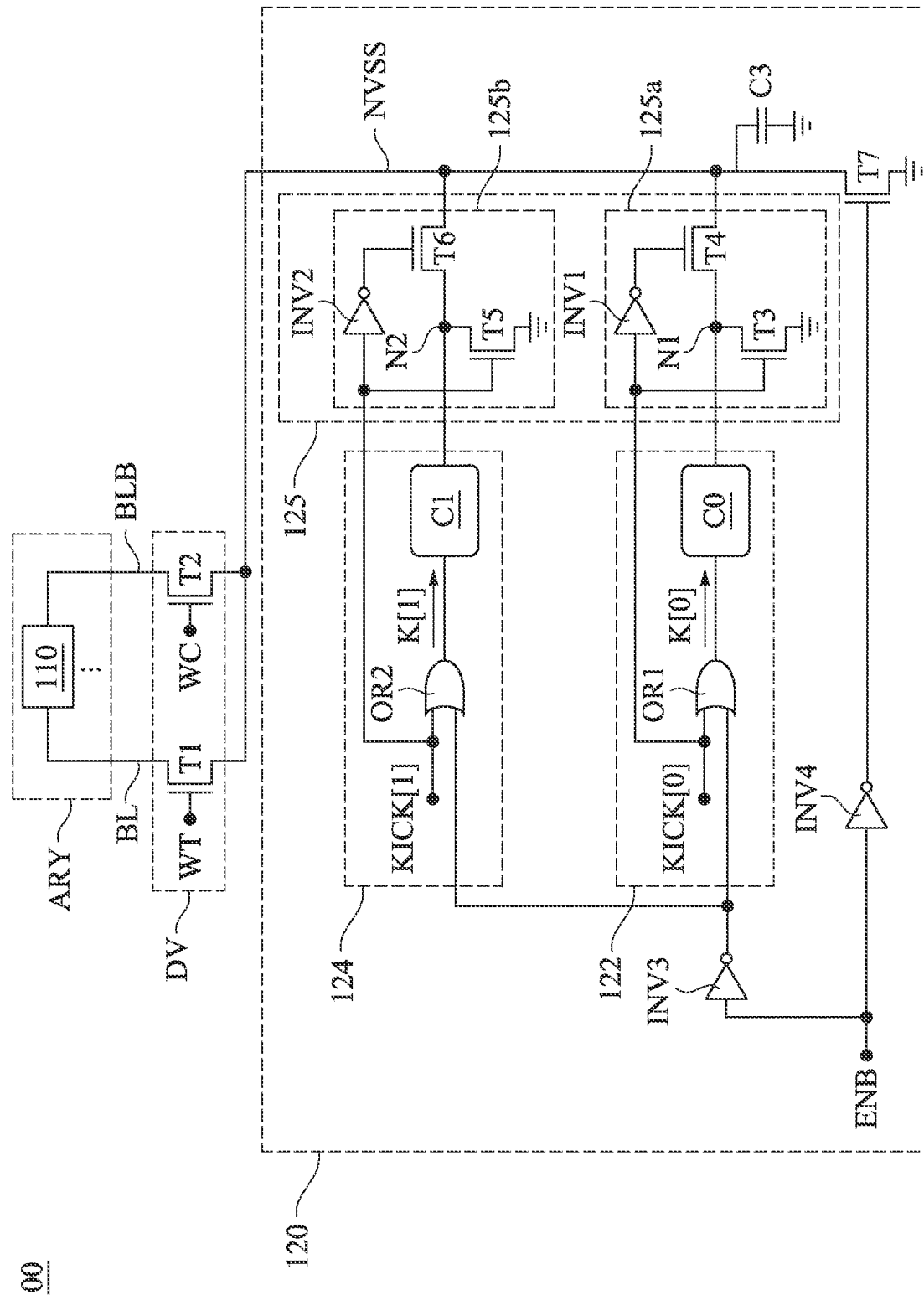
FIG. 1 is a circuit diagram of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a circuit diagram of a memory device 100, in accordance with some embodiments of the present disclosure. The memory device 100 includes a memory array ARY, a driver circuit DV, and a voltage generation circuit 120. The driver circuit DV is coupled to the memory array ARY through a pair of data lines BL and BLB (also referred to as bit lines BL and BLB). The voltage generation circuit 120 is coupled to the driver circuit DV through a negative voltage line NVSS. In some embodiments, in a write operation, the driver circuit DV is configured to connect the bit line BL or the bit line BLB to the negative voltage line NVSS, and the voltage generation circuit 120 is configured to pull down a voltage of the bit line BL or the bit line BLB to a negative voltage level through the negative voltage line NVSS. In some embodiments, the negative voltage level on the bit line BL or the bit line BLB is transmitted to a source terminal of a pass gate transistor (not shown in FIG. 1) in the bit cell 110. A gate terminal of the pass gate transistor is configured to receive a word line signal having a high logic value. The negative voltage level transmitted to the pass gate transistor is configured to increase the voltage difference between the gate and source terminals of the pass gate transistor and thus increase the current passing through the pass gate transistor. Accordingly, the increased current assists the write operation to the bit cell 110.

For illustration of FIG. 1, the memory array ARY includes a bit cell 110. The bit cell 110 is coupled to the driver circuit DV through the bit lines BL and BLB. In some embodiments, the bit cell 110 is further coupled to a word line (not shown in FIG. 1), the memory device 100 further includes a word line driver (not shown in FIG. 1) that is configured to drive the bit cell 110 through the word line in a read operation and/or a write operation. The bit cell 110 in FIG. 1 is given for illustrative purposes. Various implements are within the contemplated scope of the present disclosure. For example, in some embodiments, the memory array ARY includes multiple bit cells 110 that are arranged in rows and columns.

For illustration of FIG. 1, the driver circuit DV includes a pair of transistors T1 and T2. A first terminal of the transistor T1 is coupled to the bit line BL, and a control terminal of the transistor T1 is configured to receive a signal WT. A first terminal of the transistor T2 is coupled to the bit line BLB, and a control terminal of the transistor T2 is configured to receive a signal WC. Second terminals of the transistors T1 and T2 are coupled together to the negative voltage line NVSS. In some embodiments, the transistors T1 and T2 are n-type metal oxide semiconductor (NMOS) transistors, the transistor T1 is configured to be turned on to connect the bit line BL to the negative voltage line NVSS in response to the signal WT having a high logic value, and the transistor T2 is configured to be turned on to connect the bit line BLB to the negative voltage line NVSS in response to the signal WC having a high logic value.

For illustration of FIG. 1, the voltage generation circuit 120 is coupled to the second terminals of the transistors T1 and T2 through the negative voltage line NVSS. The voltage generation circuit 120 includes a capacitive unit 122, a capacitive unit 124, a switch circuit 125, inverters INV3 and INV4, a transistor T7, and a capacitor C4. The switch circuit 125 is coupled between the capacitive unit 122 and the negative voltage line NVSS and between the capacitive unit 124 and the negative voltage line NVSS. The capacitive units 122 and 124 are coupled in parallel between an output terminal of the inverter INV3 and the switch circuit 125. Input terminals of the inverters INV3 and INV4 are coupled together to receive an enable signal ENB. An output terminal of the inverter INV4 is coupled to a gate terminal of the transistor T7. In some embodiments, a gate terminal of a transistor is also referred to as a control terminal of the transistor. A first terminal of the transistor T7 is coupled to the negative voltage line NVSS, and a second terminal of the transistor T7 is coupled to a ground voltage. A first terminal of the capacitor C4 is coupled to the negative voltage line NVSS, and a second terminal of the capacitor C4 is coupled to a ground voltage.

In some embodiments, the inverter INV3 is configured to invert the enable signal ENB and generate an inverted enable signal to the capacitive units 122 and 124. The inverter INV4 is configured to invert the enable signal ENB and generate an inverted enable signal to the transistor T7.

For illustration of FIG. 1, the switch circuit 125 includes switch circuits 125a and 125b. The switch circuit 125a includes transistors T3-T4 and an inverter INV1. A first terminal of the transistor T4 is coupled to the negative voltage line NVSS. A first terminal of the transistor T3 is coupled to a second terminal of the transistor T4 at a node N1, and a second terminal of the transistor T3 is coupled to the ground voltage. An input terminal of the inverter INV1 and a gate terminal of the transistor T3 are coupled together to receive a kick signal KICK[0] from the capacitive unit 122. An output terminal of the inverter INV1 is coupled to a gate terminal of the transistor T4. Similarly, the switch circuit 125b includes transistors T5-T6 and an inverter INV2. A first terminal of the transistor T6 is coupled to the negative voltage line NVSS. A first terminal of the transistor T5 is coupled to a second terminal of the transistor T6 at a node N2, and a second terminal of the transistor T5 is coupled to the ground voltage. An input terminal of the inverter INV2 and a gate terminal of the transistor T5 are coupled together to receive a kick signal KICK[1] from the capacitive unit 124. An output terminal of the inverter INV2 is coupled to a gate terminal of the transistor T6.

For illustration of FIG. 1, the capacitive unit 122 includes a capacitor C0 and an OR gate OR1. A first terminal of the capacitor C0 is coupled to the transistors T3 and T4 in the switch circuit 125a at the node N1. A first input terminal of the OR gate OR1 receives the kick signal KICK[0] and is coupled to the input terminal of the inverter INV1 and the control terminal of the transistor T3 in the switch circuit 125a, a second input terminal of the OR gate OR1 is coupled to the inverter INV3, and an output terminal of the OR gate OR1 is coupled to a second terminal of the capacitor C0. Similarly, a first terminal of the capacitor C1 is coupled to the transistors T5 and T6 in the switch circuit 125b at the node N2. A first input terminal of the OR gate OR2 receives the kick signal KICK[1] and is coupled to the input terminal of the inverter INV2 and the control terminal of the transistor T5, a second input terminal of the OR gate OR2 is coupled to the inverter INV3, and an output terminal of the OR gate OR2 is coupled to a second terminal of the capacitor C1. An output terminal of the inverter INV3 is coupled to a second input terminal of the OR gate OR1 and a second input terminal of the OR gate OR2.

In some embodiments, the OR gate OR1 is configured to perform an OR operation of the kick signal KICK[0] and the inverted enable signal generated by the inverter INV3 to output a voltage signal K[0]. The OR gate OR2 is configured to perform an OR operation of the kick signal KICK[1] and the inverted enable signal generated by the inverter INV3 to output a voltage signal K[1].

In some embodiments, the switch circuit 125 is configured to connect the capacitive unit 122 and/or the capacitive unit 124 to the negative voltage line NVSS in response to the kick signals KICK[0] and KICK[1]. Specifically, the transistor T4 of the switch circuit 125a is configured to be turned on to connect the capacitor C0 of the capacitive unit 122 to the negative voltage line NVSS in response to the kick signal KICK[0], and the transistor T6 of the switch circuit 125b is configured to be turned on to connect the capacitor C1 of the capacitive unit 124 to the negative voltage line NVSS in response to the kick signal KICK[1].

In some embodiments, the present application provides a negative bit line (NBL) scheme in the write operation of the memory device 100. Specifically, the voltage of the bit line BL or the bit line BLB will be pulled down to a negative voltage level through an electric path including the negative voltage line NVSS. Specifically, the transistor T1 or the transistor T2 is turned on, and the voltage of the bit line BL or the bit line BLB will be the same as the voltage of the negative voltage line NVSS. Then, the capacitor C0 and/or the capacitor C1 are connected to the negative voltage line NVSS. The capacitor C0 and/or the capacitor C1 are configured to pull down the voltage of the negative voltage line NVSS, and thus the voltage of the bit line BL or the bit line BLB, to a negative voltage level. The negative voltage level on the bit line BL or the bit line BLB is configured to facilitate the write operation to the bit cell 110.

In some approaches, a memory device using the NBL scheme does not include a switch circuit, such as the switch circuit 125 shown in FIG. 1, and the capacitors in the memory device are directly connected to the negative voltage line. In these approaches, the capacitance of the electric path including the negative voltage line includes the capacitance of the capacitors connected to the negative voltage line and thus is large. This causes large loading on the negative voltage line, which decreases the kick efficiency of the NBL scheme and leads to more power consumption.

Compared to the approaches mentioned above, with the configurations of the present application, the memory device 100 in FIG. 1 includes the switch circuit 125 configured to connect or disconnect the capacitor C0 and/or the capacitor C1 in response to the kick signals KICK[0]-KICK[1] and the enable signal ENB. Accordingly, the embodiments of the present disclosure can dynamically regulate the capacitance of the electric path including the negative voltage line NVSS and thus improve NBL kick efficiency and energy efficiency.

In some embodiments, the capacitor C4 represents the capacitance of the negative voltage line NVSS itself and/or the capacitance of other electric lines and/or components (not shown in FIG. 1) coupled to the negative voltage line NVSS.

The configuration of memory device 100 in FIG. 1 is given for illustrative purposes. Various implements are within the contemplated scope of the present disclosure. For example, in some embodiments, the memory array ARY includes multiple bit cells 110 that are arranged in rows and columns. In various embodiments, the transistors T1-T7 are p-type metal oxide semiconductor (PMOS) transistors that are turned on when receiving signal having the low logic value at their control terminals and are turned off when receiving signal having the high logic value at their control terminals. In some embodiments, the memory device 100 further includes other components and/or circuits not shown in FIG. 1, including, for example, a control circuit configured to generating the enable signal ENB according to a clock signal.

Figure 2:
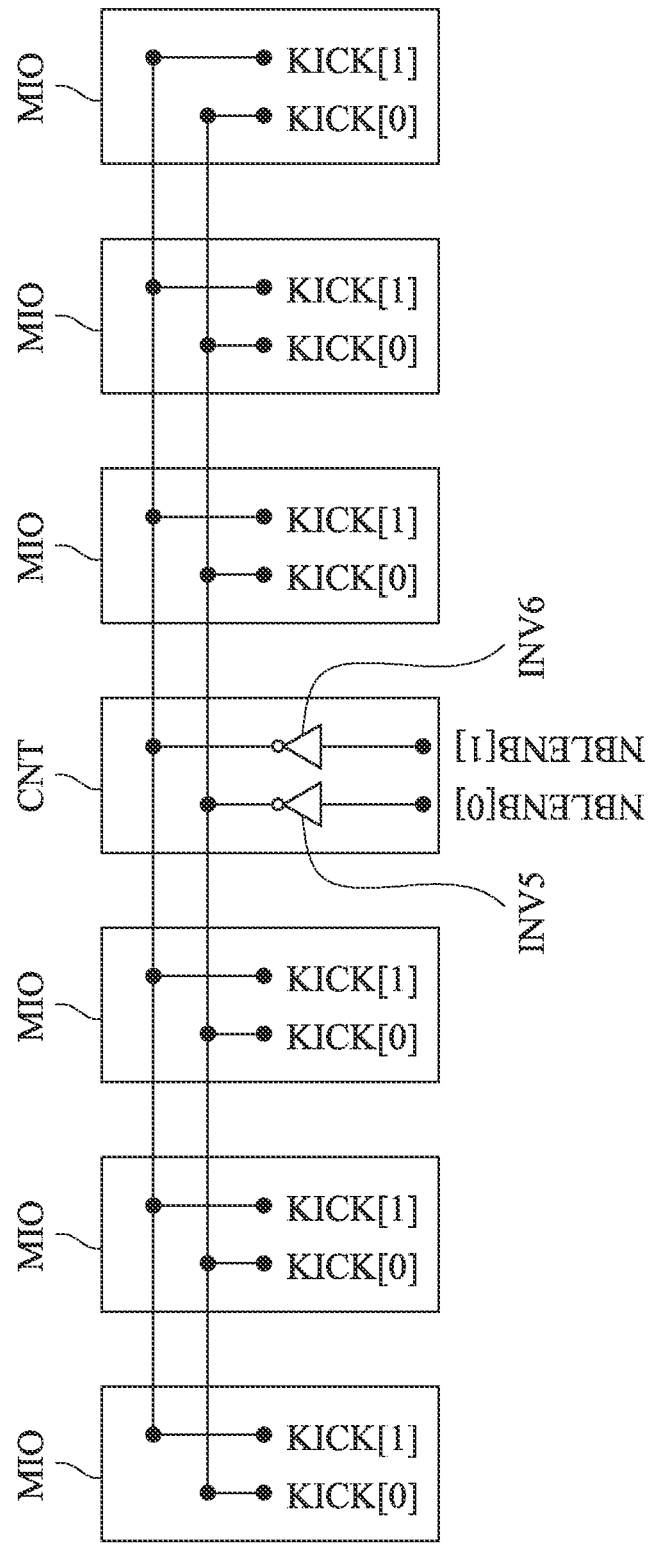
FIG. 2 is a circuit diagram of a signal generation circuit, in accordance with some embodiments of the present disclosure.

Reference is now made to FIG. 2. FIG. 2 is a circuit diagram of a signal generation circuit CNT, in accordance with some embodiments of the present disclosure. With respect to the embodiments of FIG. 2, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2. The signal generation circuit CNT is configured to generate the kick signals KICK[0] and KICK[1] for the memory device in FIG. 1. The signal generation circuit CNT includes inverters INV5 and INV6. The inverter INV5 is configured to generate the kick signal KICK[0] according to an enable signal NBLENB[0], and the inverter INV6 is configured to generate the kick signal KICK[1] according to an enable signal NBLENB[1]. The enable signals NBLENB[0] and NBLENB[1] are different signals. The generated kick signals KICK[0] and KICK[1] are transmitted to input/output circuits MIO of the memory device 100. In some embodiments, each of the input/output circuits MIO includes the voltage generation circuit 120 as shown in FIG. 1 to implement the NBL scheme mentioned above, and the kick signals KICK[0] and KICK[1] are transmitted to the capacitive units 122 and 124 and the switch circuit 125 of the voltage generation circuit 120. In some embodiments, the signal generation circuit CNT is referred to as a control circuit. The configuration of the signal generation circuit CNT is given for illustrative purposes. Various implements are within the contemplated scope of the present disclosure. For example, in some embodiments, the signal generation circuit CNT further includes other components and/or circuits not shown in FIG. 2, including, for example, a circuit configured to generating the enable signals NBLENB[0] and NBLENB[1] according to a clock signal.

Figure 3:
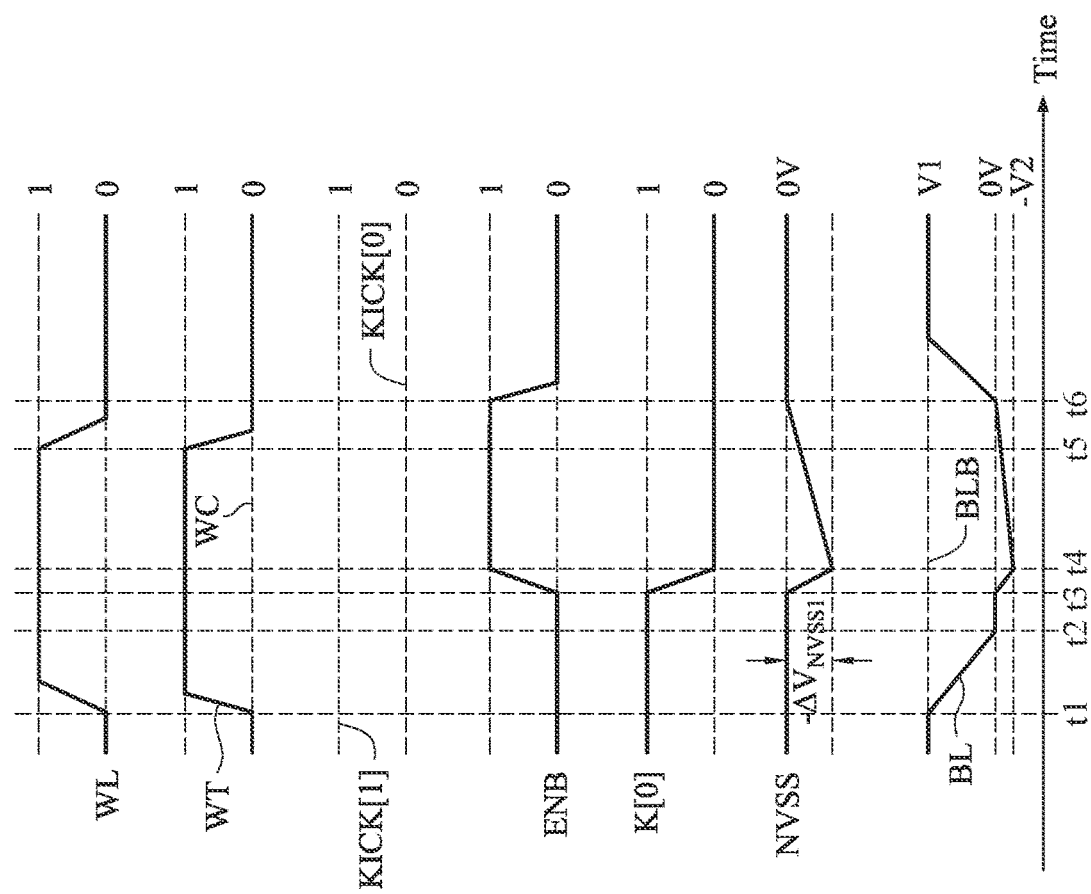
FIG. 3 is a time sequence diagram for signals used in the memory device as shown in FIG. 1, in accordance with some embodiments of the present disclosure.

Please refer to FIGS. 1 and 3. FIG. 3 is a time sequence diagram for signals used in the memory device 100 as shown in FIG. 1, in accordance with some embodiments of the present disclosure. With respect to the embodiments of FIG. 3, like elements in FIG. 1 are designated with the same reference numbers for ease of understanding. In some embodiments, the memory device 100 is configured to operate in a first mode to connect the capacitor C0 to the negative voltage line NVSS and disconnect the capacitor C1 from the negative voltage line NVSS according to the signals as shown in FIG. 3. In some embodiments, a word line signal WL in FIG. 3 is received by the bit cell 110 in FIG. 1 and is configured to enable the bit cell 110 during the write operation.

In the first mode, the kick signal KICK[0] maintains at a low logic level ("0" in FIG. 3). The switch circuit 125a receives the kick signal KICK[0] through the capacitive unit 122. The inverter INV1 generates, in response to the kick signal KICK[0] having the low logic level, an inverted kick signal having a high logic level. Thus, when receiving the inverted kick signal at its gate terminal, the transistor T4 of the switch circuit 125a is configured to be turned on to connect the capacitor C0 of the capacitive unit 122 to the negative voltage line NVSS. In addition, when the gate terminal of the transistor T3 receives the kick signal KICK[0], the transistor T3 is configured to be turned off.

In the first mode, the kick signal KICK[1] maintains at the high logic level ("1" in FIG. 3). The switch circuit 125b receives the kick signal KICK[1] through the capacitive unit 124. The inverter INV2 generates, in response to the kick signal KICK[1] having the high logic level, an inverted kick signal having the low logic level. Thus, when receiving the inverted kick signal at its gate terminal, the transistor T6 of the switch circuit 125b is configured to be turned off to disconnect the capacitor C1 of the capacitive unit 124 from the negative voltage line NVSS. In addition, when the gate terminal of the transistor T5 receives the kick signal KICK[1], the transistor T5 is configured to be turned on to pull down the voltage at the node N2 to the ground voltage.

At a time t1 of FIG. 3, the word line signal WL and the signal WT start to rise to have the high logic level, and the transistor T1 is configured to be turned on, in response to the signal WT, to connect the bit line BL to the negative voltage line NVSS. The enable signal ENB is at low logic level, the inverter INV4 is configured to generate an inverted enable signal to the gate terminal of the transistor T7, and the transistor T7 is turned on in response to the inverted enable signal having the high logic level. Accordingly, the negative voltage line NVSS is connected to the ground voltage, and the voltage on the bit line BL starts to fall from a voltage V1 at the time t1 and is pulled down to the ground voltage at time t2.

At a time t3, the enable signal ENB starts to rise from the low logic level to the high logic level, the inverter INV3 is configured to generate the inverted enable signal falling from the high logic level to the low logic level, and the OR gate OR1 is configured to generate the voltage signal K[0] according to the kick signal KICK[0] and the inverted enable signal. According to the truth table for OR gate, at the time t3, the voltage signal K[0] generated by the OR gate OR1 starts to fall from the high logic level to the low logic level, as shown in FIG. 3. The capacitor C0 pulls down the voltage at the node N1 to the ground voltage (e.g., 0 Volt) in response to the voltage signal K[0] falling to the low logic level. The transistor T4 is turned on to connect the node N1 to the negative voltage line NVSS in the first mode. Accordingly, the negative voltage line NVSS and the bit line BL coupled to the negative voltage line NVSS are discharged based on the voltage level of the node N1.

At a time t4, the voltage on the negative voltage line NVSS is decreased by a voltage difference $-\Delta V_{NVSS1}$, and the voltage on the bit line BL is pulled down to the negative voltage level $-V2$.

At a time t5, the word line signal WL and the signal WT start to fall back to the low logic level, and the bit line BL is disconnected from the negative voltage line NVSS.

At a time t6, the enable signal ENB starts to fall to the low logic level, and the transistor T7 is turned on to connect the negative voltage NVSS to the ground voltage.

Thus, in the first mode, the kick signal KICK[0] has the low logic level, and only the capacitor C0 is connected to the negative voltage line NVSS, to pull down the voltage on the bit line BL. In some embodiments, in the first mode, the capacitance of the electric path including the negative voltage line can be obtained through the formula below:

$$C_{nvss0} = C_{cap1} + C_{other1}$$

In the formula above, the capacitance of the electric path when the kick signal KICK[0] is enabled is denoted as "$C_{nvss0}$", the capacitance of the capacitor C0 is denoted as "$C_{cap1}$", and the capacitance of other electric lines and/or components connected to the electric path, including the capacitance C4, is denoted as "$C_{other1}$."

In some embodiments, the NBL kick efficiency in the first mode can be obtained through the formula below:

$$E_{k0\_D} = \Delta V_{NVSS1}/\Delta V_{K[0]} = C_{cap1}/C_{nvss0}$$

In the formula above, the NBL kick efficiency in the first mode is denoted as "$E_{k0\_D}$" and is defined as the ratio of the voltage change on the negative voltage line NVSS ($\Delta V_{NVSS1}$) to the voltage change of the voltage signal K[0] ($\Delta V_{K[0]}$). In some embodiments, the NBL kick efficiency is proportional to the capacitance of the capacitor C0 (denoted as "$C_{cap1}$") that receives the voltage signal K[0] and is disproportional to the total capacitance of the electric path (denoted as "$C_{nvss0}$").

Figure 4:
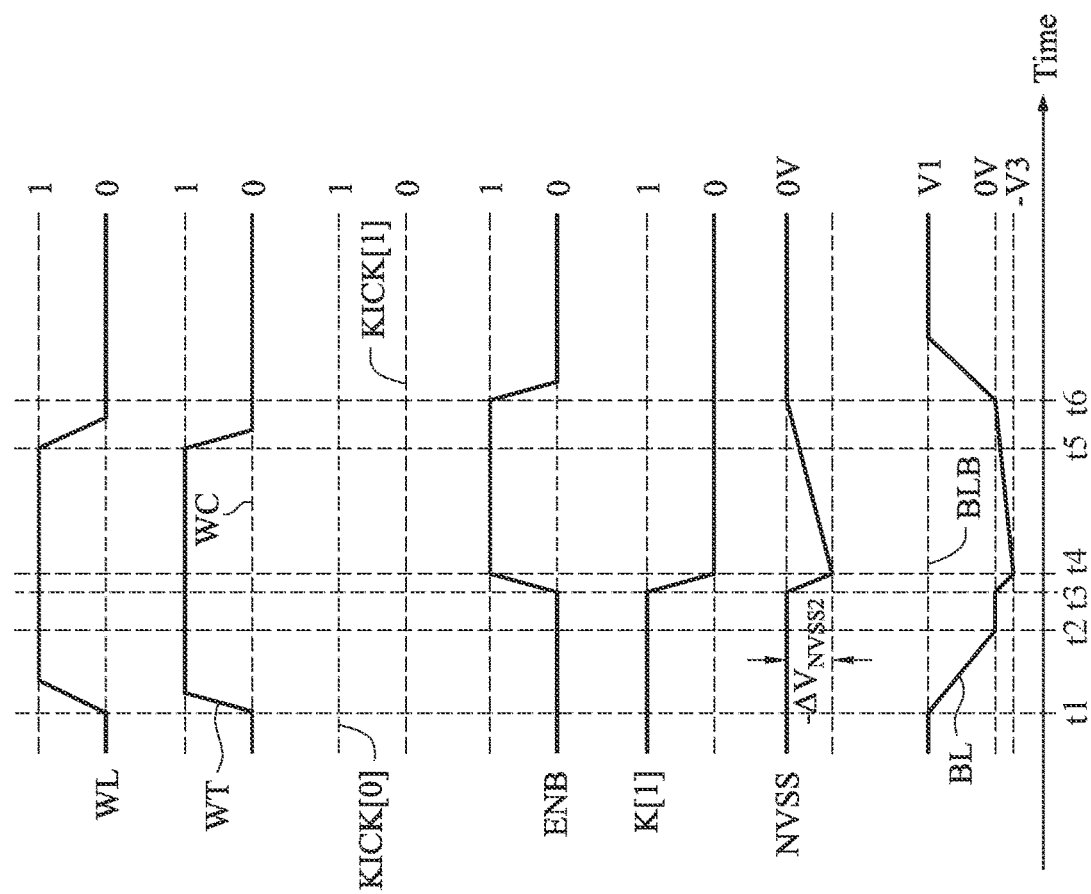
FIG. 4 is a time sequence diagram for signals used in the memory device as shown in FIG. 1, in accordance with various embodiments of the present disclosure.

Please refer to FIGS. 1 and 4. FIG. 4 is a time sequence diagram for signals used in the memory device 100 as shown in FIG. 1, in accordance with some embodiments of the present disclosure. With respect to the embodiments of FIG. 4, like elements in FIG. 3 are designated with the same reference numbers for ease of understanding. In some embodiments, the memory device 100 is configured to operate in a second mode to connect the capacitor C1 to the negative voltage line NVSS and disconnect the capacitor C0 from the negative voltage line NVSS according to the signals as shown in FIG. 4.

In the second mode, the kick signal KICK[1] maintains at the low logic level. The inverter INV2 generates, in response to the kick signal KICK[1] having the low logic level, an inverted kick signal having a high logic level. Thus, the transistor T6 is configured to be turned on to connect the capacitor C1 to the negative voltage line NVSS. In addition, the transistor T5 is configured to be turned off in response to the kick signal KICK[1].

In the second mode, the kick signal KICK[0] maintains at the high logic level. The inverter INV1 generates, in response to the kick signal KICK[0] having the high logic level, an inverted kick signal having the low logic level. Thus, the transistor T6 is configured to be turned off to disconnect the capacitor C1 from the negative voltage line NVSS. In addition, the transistor T5 is configured to be turned on to pull down the voltage at the node N2 to the ground voltage in response to the kick signal KICK[1].

At the time t1, the word line signal WL and the signal WT start to rise to the high logic level, the transistor T1 is turned on to connect the bit line BL to the negative voltage line NVSS, the inverter INV4 generates an inverted enable signal to turn on the transistor T7, the negative voltage line NVSS is connected to the ground voltage, and the voltage on the bit line BL is pulled down. At the time t2, the voltage on the bit line BL is pulled down to the ground voltage.

At the time t3, the enable signal ENB starts to rise from the low logic level to the high logic level, the inverter INV3 generates the inverted enable signal, and the OR gate OR2 generates the voltage signal K[1] according to the kick signal KICK[1] and the inverted enable signal. According to the truth table for OR gate, at the time t3, the voltage signal K[1] starts to fall from the high logic level to the low logic level, as shown in FIG. 4. The capacitor C1 pulls down the voltage at the node N2 in response to the voltage signal K[1]. Because the transistor T6 is turned on to connect the capacitor C1 to the negative voltage line NVSS in the second mode, the capacitor C1 is configured to pulls down the voltage on the negative voltage line NVSS at the time t3 in response to the voltage signal K[1]. As the transistor T1 is turned on to connect the bit line BL to the negative voltage line NVSS, the voltage on the bit line BL starts to fall at the time t3.

At the time t3, because the kick signal KICK[0] maintains at the high logic level, according to the truth table for OR gate, the voltage signal K[0] generated by the OR gate OR1 maintains at the high logic level regardless of the level of the inverted enable signal. The capacitor C0 receives the voltage signal K[0] with no change in voltage level and is configured to maintain the voltage at the node N1.

At the time t4, the voltage on the negative voltage line NVSS is decreased by a voltage difference $-\Delta V_{NVSS2}$, and the voltage on the bit line BL is pulled down to the negative voltage level $-V3$. In some embodiments, the negative voltage level $-V3$ is different from the negative voltage level $-V2$ in FIG. 3. For example, the negative voltage level $-V2$ is lower than the negative voltage level $-V3$.

At the time t5, the word line signal WL and the signal WT start to fall back to the low logic level, and the bit line BL is disconnected from the negative voltage line NVSS.

At the time t6, the enable signal ENB starts to fall to the low logic level, and the transistor T7 is turned on to connect the negative voltage NVSS to the ground voltage.

Thus, in the second mode, the kick signal KICK[1] is enabled and has the low logic level, and only the capacitor C1 is connected to the negative voltage line NVSS, to pull down the voltage on the bit line BL. In some embodiments, in the second mode, the capacitance of the electric path including the negative voltage line can be obtained through the formula below:

$$C_{nvss1} = C_{cap2} + C_{other2}$$

In the formula above, the capacitance of the electric path when the kick signal KICK[1] is enabled is denoted as "$C_{nvss1}$", the capacitance of the capacitor C1 is denoted as "$C_{cap2}$", and the capacitance of other electric lines and/or components connected to the electric path, including the capacitance C4, is denoted as "$C_{other2}$."

In some embodiments, the NBL kick efficiency in the second mode can be obtained through the formula below:

$$E_{k1\_D} = \Delta V_{NVSS2}/\Delta V_{K[1]} = C_{cap2}/C_{nvss1}$$

In the formula above, the NBL kick efficiency in the second mode is denoted as "$E_{k1\_D}$" and is defined as the ratio of the voltage change on the negative voltage line NVSS ($\Delta V_{NVSS2}$) to the voltage change of the voltage signal K[1] ($\Delta V_{K[1]}$). In some embodiments, the NBL kick efficiency is proportional to the capacitance of the capacitor C1 ($C_{cap2}$) that receives the voltage signal K[1] and is disproportional to the total capacitance of the electric path ($C_{nvss1}$).

Figure 5:
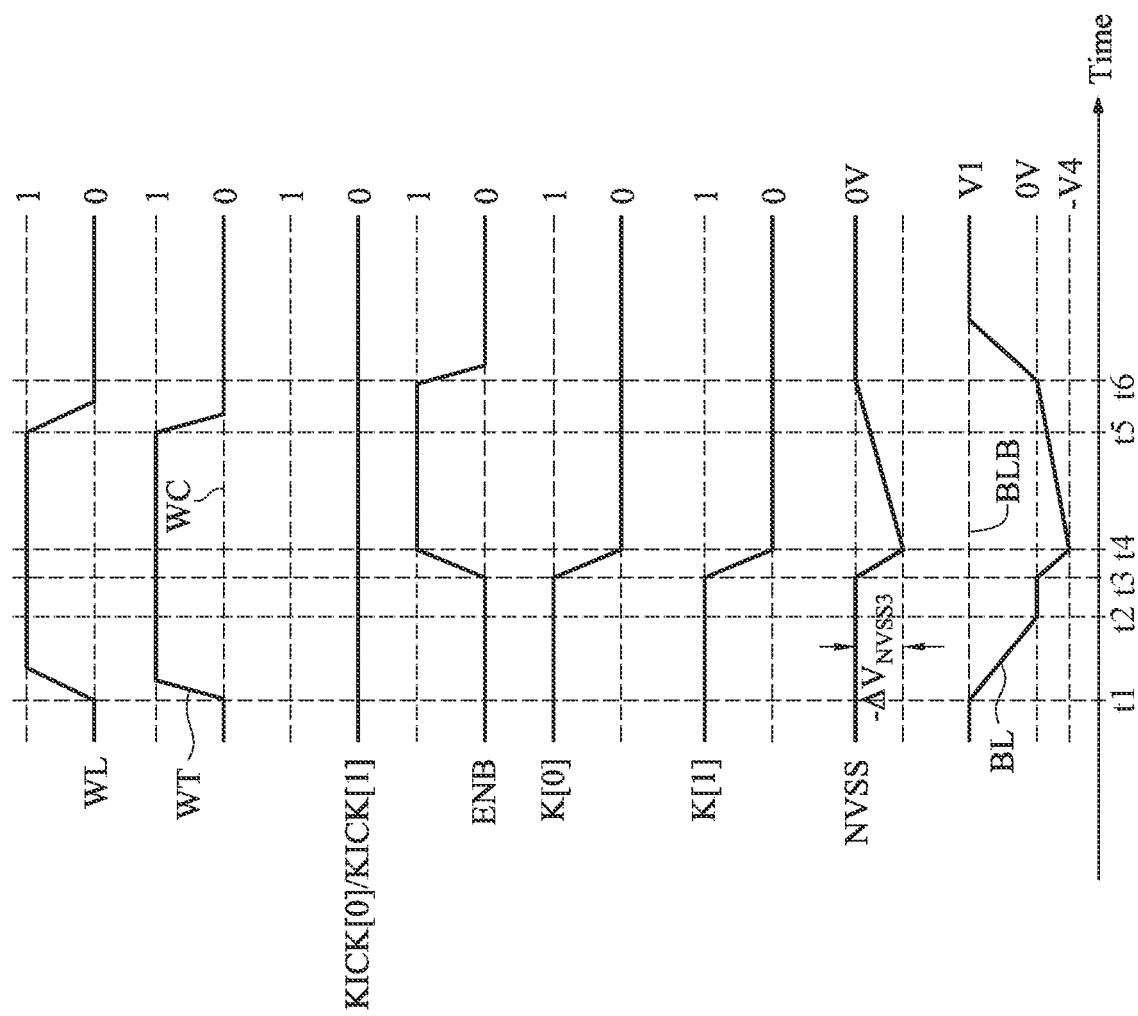
FIG. 5 is a time sequence diagram for signals used in the memory device as shown in FIG. 1, in accordance with various embodiments of the present disclosure.

Please refer to FIGS. 1 and 5. FIG. 5 is a time sequence diagram for signals used in the memory device 100 as shown in FIG. 1, in accordance with various embodiments of the present disclosure. With respect to the embodiments of FIG. 5, like elements in FIG. 3 are designated with the same reference numbers for ease of understanding. In some embodiments, the memory device 100 is configured to operate in a third mode to connect the capacitors C0 and C1 to the negative voltage line NVSS according to the signals as shown in FIG. 5. Compared with the first mode, in the third mode, the kick signals KICK[0] and KICK[1] maintain at the low logic level, and the transistors T4 and T6 are configured to connect the capacitors C0 and C1 respectively to the negative voltage line NVSS. In the third mode, the capacitive unit 122 and the switch circuit 125a operate in a similar way as in the first mode, and the capacitive unit 124 and the switch circuit 125b operate in a similar way as in the second mode. Alternatively stated, at the time t3, the capacitors C0 and C1 pulls down the voltage on the negative voltage line NVSS and the voltage on the bit line BL. At the time t4, the voltage on the negative voltage line NVSS is decreased by a voltage difference-$\Delta V_{NVSS3}$, and the voltage on the bit line BL is pulled down to the negative voltage level −V4. In some embodiments, because two capacitors C0 and C1 are used to pull down the voltage on the negative voltage line NVSS and the bit line BL, the voltage difference $\Delta V_{NVSS3}$ is larger than the voltage difference $\Delta V_{NVSS1}$ and/or the voltage difference $\Delta V_{NVSS2}$, and the negative voltage level −V4 is lower than the negative voltage level −V2 and/or the negative voltage level −V3.

Thus, in the third mode, the kick signals KICK[0] and KICK[1] are enabled and have the low logic level, and the capacitors C0 and C1 are connected to the negative voltage line NVSS, to pull down the voltage on the bit line BL. In some embodiments, in the third mode, the capacitance of the electric path including the negative voltage line can be obtained through the formula below:

$$C_{nvss2} = C_{cap1} + C_{cap2} + C_{other3}$$

In the formula above, the capacitance of the electric path when the kick signals KICK[0] and KICK[1] are enabled is denoted as "$C_{nvss2}$", the capacitance of the capacitor C0 is denoted as "$C_{cap1}$", the capacitance of the capacitor C1 is denoted as "$C_{cap2}$", and the capacitance of other electric lines and/or components connected to the electric path, including the capacitance C4, is denoted as "$C_{other3}$."

In some embodiments, the NBL kick efficiency in the third mode can be obtained through the formula below:

$$E_{k01\_D} = \Delta V_{NVSS3}/\Delta V_{K[01]} = (C_{cap1} + C_{cap2})/C_{nvss2}$$

In the formula above, the NBL kick efficiency in the third mode is denoted as "$E_{k01\_D}$" and is defined as the ratio of the voltage change on the negative voltage line NVSS ($\Delta V_{NVSS3}$) to the voltage change of the voltage signal K[0] or the voltage signal K[1] ($\Delta V_{K[01]}$). In some embodiments, $\Delta V_{K[01]}$, $\Delta V_{K[0]}$, and $\Delta V_{K[1]}$ are equal to each other. In some embodiments, the NBL kick efficiency is proportional to the sum of the capacitances of the capacitors C0 and C1 ($C_{cap1}+C_{cap2}$) and is disproportional to the total capacitance of the electric path ($C_{nvss2}$).

In some embodiments, the capacitance of the capacitor C0 ($C_{cap1}$) is different from the capacitance of the capacitor C1 ($C_{cap2}$), and the capacitance of the electric path including the negative voltage line NVSS and the NBL kick efficiency are different in the three modes discussed above. In some embodiments, the capacitance of the capacitor C0 is larger than the capacitance of the capacitor C1. In some embodiments, the capacitor C0 and the capacitor C1 are metal-oxide-semiconductor (MOS) capacitors, metal capacitors, or the combination thereof. In some embodiments, the capacitor C0 is a MOS capacitor for small word-depth SRAM, and the capacitor C1 is a metal capacitor for big word-depth SRAM. In some embodiments, the memory device 100 operates in one of the three modes discussed above according to an NBL level requirement for the memory device 100 and/or the minimum voltage that the memory device 100 requires to operate.

Figure 6:
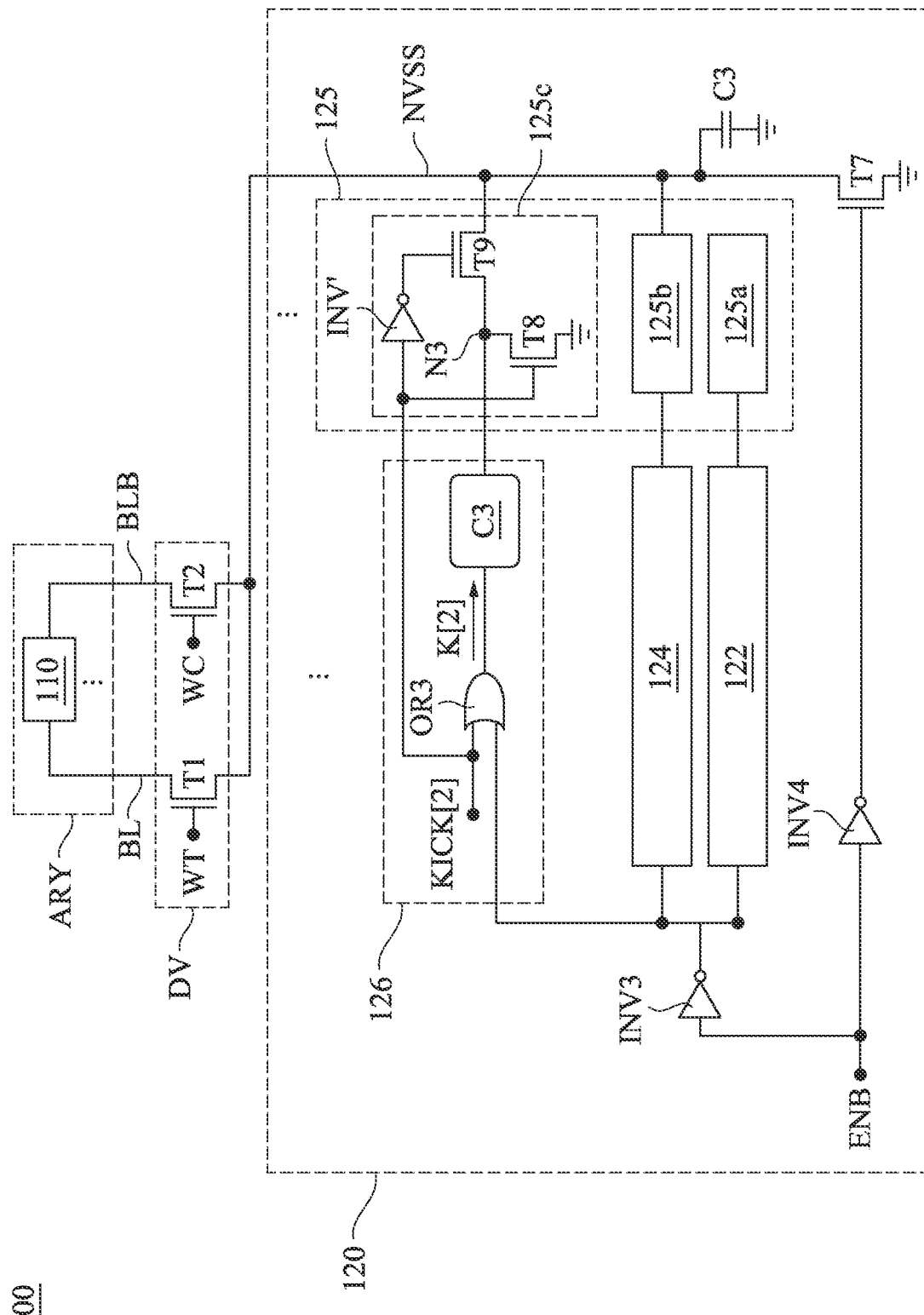
FIG. 6 is a circuit diagram of a memory device, in accordance with various embodiments of the present disclosure.

Please refer to FIG. 6. FIG. 6 is a circuit diagram of a memory device 600, in accordance with various embodiments of the present disclosure. With respect to the embodiments of FIG. 6, like elements in FIG. 1 are designated with the same reference numbers for ease of understanding. The memory device 600 has a configuration that is similar to the one of the memory device 100 shown in FIG. 1. Compared to the memory device 100 of FIG. 1, the memory device 600 further includes a capacitive unit 126 and a switch circuit 125c. The capacitive unit 126 includes components similar to the ones in the capacitive units 122 and 124, including an OR gate OR3 and a capacitor C3. The switch circuit 125c includes components similar to the ones in the switch circuits 125a and 125b, including transistors T8 and T9 and an inverter INV'.

In some embodiments, the memory device 600 are configured to operate in more than three modes to connect the capacitive unit 122, the capacitive unit 124, and/or the capacitive unit 126 to the negative voltage line NVSS through the switch circuit 125, and the capacitive unit 122, the capacitive unit 124, and/or the capacitive unit 126 are configured to pull down the voltage on the negative voltage line NVSS and the bit line BL or the bit line BLB. Accordingly, in some embodiments, the voltage on the bit line BL can be pulled down to a negative voltage level that is lower than the negative voltage level −V4 as shown in FIG. 5.

For example, in one of the additional operation modes, the memory device 600 connects two of the capacitive units 122, 124, and 126 to the negative voltage line NVSS through the switch circuit 125, and accordingly, the two connected capacitive units pull down the voltage on the negative voltage line NVSS and the bit line BL or the bit line BLB.

In yet another embodiments of the operation modes, the memory device 600 connects all of the capacitive units 122, 124, and 126 to the negative voltage line NVSS through the switch circuit 125, and accordingly, the capacitive units 122, 124, and 126 cooperate to pull down the voltage on the negative voltage line NVSS and the bit line BL or the bit line BLB.

In some embodiments, the voltage change on the negative voltage line NVSS ($\Delta V_{NVSS}$) induced by the capacitive units 122, 124, and 126 is associated with a number of the capacitive units that are connected to the negative voltage line NVSS. For example, the more the capacitive units are connected, the greater the voltage change on the negative voltage line NVSS is. Similarly, the voltage on the bit line BL or bit line BLB can be pulled down to a lower voltage as the number of the capacitive units that are connected to the negative voltage line NVSS increases.

In some embodiments, the memory device 600 in FIG. 6 further includes switch circuits that have configurations similar to the ones of the switch circuits 125a, 125b, and 125c and further includes capacitive units that have configurations similar to the ones of the capacitive units 122, 124, and 126. Accordingly, the memory device 600 is configured to pull down the voltage on the bit line BL or the bit line BLB to a lower negative voltage level.

Figure 7:
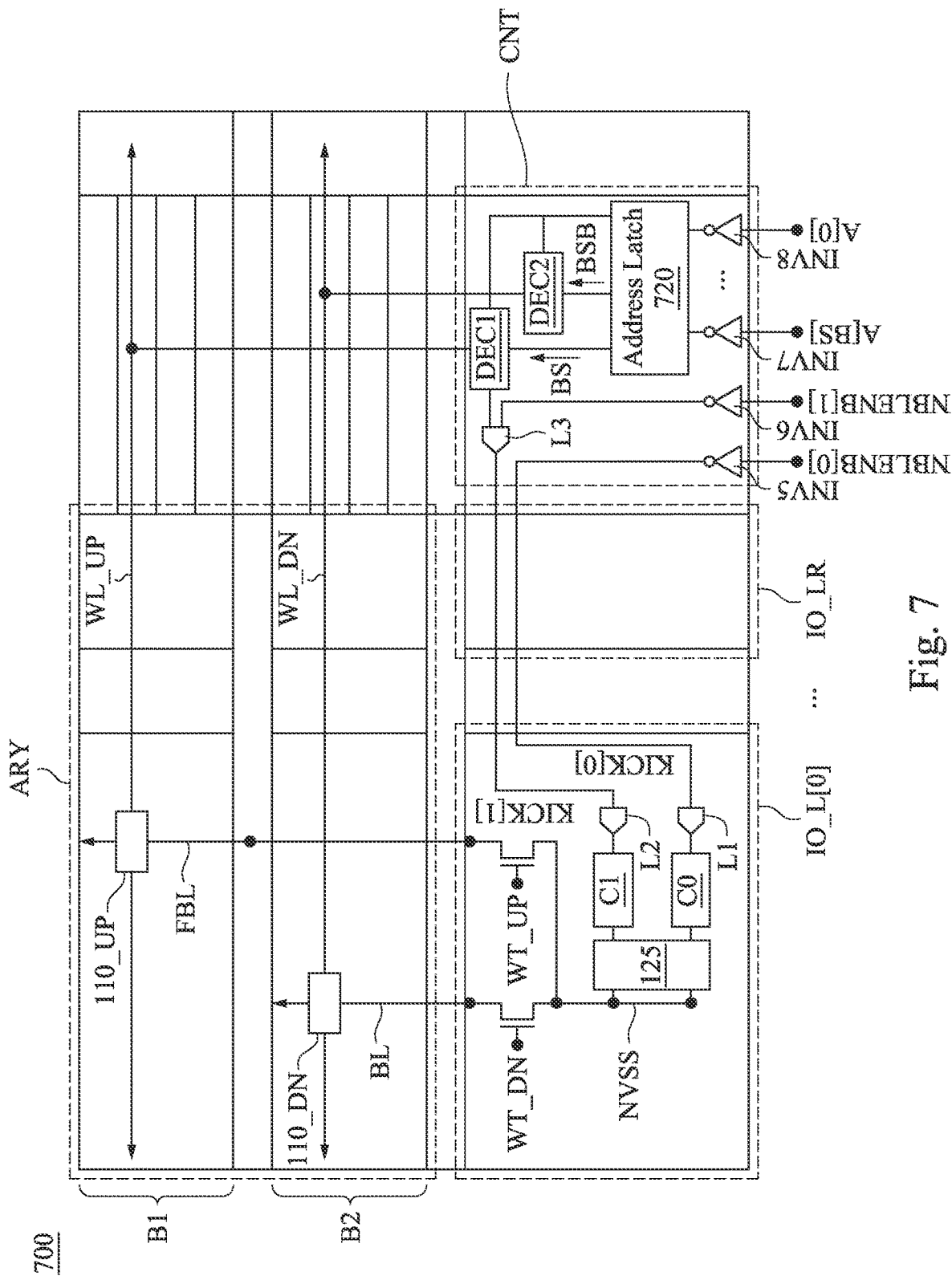
FIG. 7 is a circuit diagram of a memory device, in accordance with various embodiments of the present disclosure.

Please refer to FIG. 7. FIG. 7 is a circuit diagram of a memory device 700, in accordance with various embodiments of the present disclosure. With respect to the embodiments of FIG. 7, like elements in FIG. 1 are designated with the same reference numbers for ease of understanding. The memory device 700 includes the memory array ARY, multiple input/output (IO) circuits including, for example, I/O circuits IO_L[0] and IO_LR, and a control circuit CNT. The memory array ARY corresponds to the memory array ARY as shown in FIG. 1 and includes multiple bit cells including, for example, bit cells 110_UP and 110_DN. Each of the I/O circuits is configured with respect to, for example, the driver circuit DV and the voltage generation circuit 120 of the memory device 100 as shown in FIG. 1. For example, the I/O circuit IO_L[0] includes transistors WT_DN and WT_UP corresponding to the transistor WT shown in FIG. 1, the switch circuit 125, the capacitors C0 and C1, and logic gates L1 and L2 corresponding to the OR gates OR1 and OR2 shown in FIG. 1.

In some embodiments, the memory device 700 adopts a flying bit line scheme, including (memory) banks B1-B2 and a bit line FBL. As shown in FIG. 7, the bank B1 is referred to as an upper bank, the bank B2 is referred to as a lower bank, and the bit line FBL that extends across the bank B2 is referred to as a fly bit line. For illustration of FIG. 7, the bit cell 110_UP is arranged in the bank B1 of the memory array ARY, and the bit cell 110_DN is arranged in the bank B2 of the memory array ARY. The bank B2 is arranged between the bank B1 and the I/O circuit IO_L[0]. The transistor WT_UP is coupled to the bit cell 110_UP through a bit line FBL, and the transistor WT_DN is coupled to the bit cell 110_DN through a bit line BL. In some embodiments, because the bit line FBL is longer than the bit line BL, the capacitance of the bit line FBL is larger than the capacitance of the bit line BL, and the NBL level requirements for perform write operation to the bit cells 110_UP and 110_DN are different. The detailed configurations are given in the following paragraphs.

In some embodiments, to perform the write operation to the bit cell 110_DN, the switch circuit 125 is configured to connect the capacitor C0 to the negative voltage line NVSS. The capacitor C0 is configured to pull down the voltage of the bit line BL to a first negative voltage level in response to the kick signal KICK[0].

In other embodiments, to perform the write operation to the bit cell 110_UP, the switch circuit 125 is configured to connect the capacitors C0 and C1 to the negative voltage line NVSS. The capacitors C0 and C1 are configured to pull down the voltage of the bit line FBL to a second negative voltage level in response to the kick signals KICK[0] and KICK[1]. In some embodiments, as two capacitors C0 and C1 are used to pull down the voltage on the bit line FBL, the second negative voltage level is lower than the first negative voltage level.

For illustration of FIG. 7, the control circuit CNT includes inverters INV5-INV8, an address latch 720, decoders DEC1 and DEC2, and a logic gate L3. Operations of the inverters INV5 and INV6 are discussed above in the embodiments of FIG. 2, and details of the embodiment in FIG. 2 can be referred to. The inverters INV7 and INV8 are configured to receive address signals A[BS] and A[0] respectively and transmit the inverted address signals to the address latch 720. The address signal A[BS] is as a bank select signal, and the address latch 720 is configured to generate signals BS and/or BSB according to the address signal A[BS]. The signal BSB is an inverted signal of the signal BS. The decoders DEC1 and DEC2 receive the signals BS and BSB respectively and are configured to activate the bit cell in the bank B1 (such as the bit cell 110_UP) through a word line (such as a word line WL_UP) or the bit cell in the bank B2 (such as the bit cell 110_DN) through a word line (such as a word line WL_DN), according to the signals BS and BSB. When the decoder DEC1 activates the bit cell in the bank B1, the decoder DEC1 is further configured to transmit a signal to the logic gate L3, and the logic gate L3 is configured to generate the kick signal KICK[1] to enable the capacitor C1 according to the signal received from the decoder DEC and the inverted enable signal NBLENB[1].

In some embodiments, other than the inverters INV5-INV8, the control circuit CNT further includes more inverters configured to receive address signals, such as the address signals A[BS] and A[0]. For example, the address corresponding to a bit cell arranged in one of the banks B1-B2 includes a number N of bits and is provided to the address latch 720 by the number N of address signals A[N−1]-A[0]. In some embodiments, each of the number N of inverters in the control circuit CNT receives a corresponding one of the address signals A[N−1]-A[0] and transmits a corresponding inverted address signal to the address latch 720. The assigned bit cell corresponding to the bit cell is accessed accordingly. In some embodiments, the number N of inverters are configured with respect to, for example, the inverter INV8 of FIG. 7.

The configuration of the memory device 700 in FIG. 7 is given for illustrative purposes. Various implements are within the contemplated scope of the present disclosure. For example, in some embodiments, the memory device 700 further includes complementary bit lines that are coupled to the bit cells 110_UP and 110_DN. In some embodiments, the I/O circuit IO_L[0] includes more than two capacitors and can operate in more than two modes.

Figure 8:
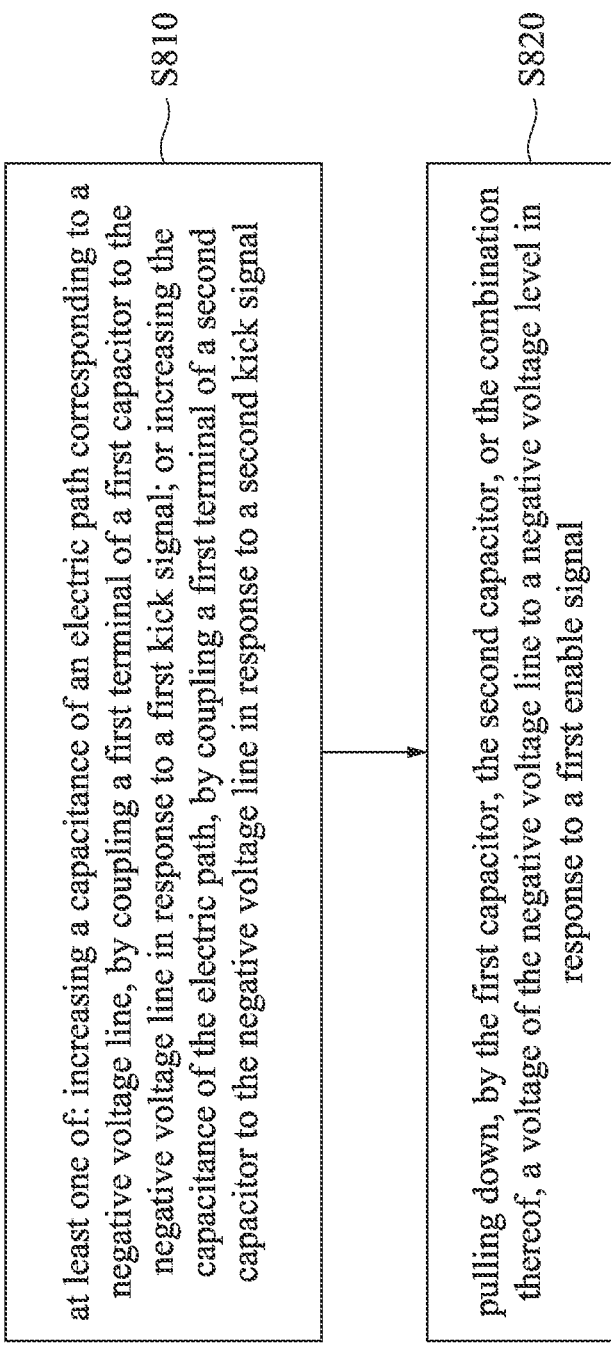
FIG. 8 is a flowchart of a method for operating the memory device as shown in FIG. 1, in accordance with some embodiments of the present disclosure.

Please refer to FIG. 8. FIG. 8 is a flowchart of a method 800 for operating the memory device 100 as shown in FIG. 1, in accordance with some embodiments of the present disclosure. The method 800 includes steps S810 and S820. The method 800 and its steps can be implemented through the previous embodiments including, for example, the memory devices 100, 600, and 700.

For illustration of FIGS. 1 and 8, at the step S810, at least one of the following sub-steps is implemented: (a) increasing the capacitance of the electric path including the negative voltage line NVSS, by coupling the first terminal of the capacitor C0 to the negative voltage line NVSS in response to the kick signal KICK[0]; or (b) increasing the capacitance of the electric path including the negative voltage line NVSS, by coupling the first terminal of the capacitor C1 to the negative voltage line NVSS in response to the kick signal KICK[1].

At the step S820, the voltage of the negative voltage line NVSS is pulled down by the capacitor C0 and/or the capacitor C1 to a negative voltage level in response to the enable signal ENB.

In some embodiments, the negative voltage line NVSS is coupled between the driver circuit DV and the first terminal of the transistor T7, the driver circuit DV is coupled to the memory array ARY, and the second terminal of the transistor T7 is coupled to the ground voltage, as shown in FIG. 1.

In some embodiments, increasing the capacitance of the electric path including the negative voltage line NVSS by coupling the first terminal of the capacitor C0 to the negative voltage line NVSS includes turning on the transistor T4 in response to the kick signal KICK[0].

In some embodiments, the method 800 further includes: coupling the first terminal of the capacitor C0 to the negative voltage line NVSS in response to the kick signal KICK[0] having the low logic value, so that the capacitance of the electric path is increased by the capacitance of the capacitor C0; and coupling the first terminal of the capacitor C1 to the negative voltage line NVSS in response to the kick signal KICK[1] having the low logic value, so that the capacitance of the electric path is further increased by the capacitance of the capacitor C1. In some embodiments, the capacitance of the capacitor C0 is different from the capacitance of the capacitor C1.

In some embodiments, the method 800 further includes: by the OR gate OR1, generating the voltage signal K[0] in response to the enable signal ENB and the kick signal KICK[0] and transmitting the voltage signal K[0] to the second terminal of the capacitor C0. In some embodiments, the method 800 further includes: controlling the voltage level of the voltage signal K[0] to decrease by the voltage difference $\Delta V_{K[0]}$ in response to the enable signal ENB, and the voltage difference $\Delta V_{K[0]}$ is associated with the negative voltage level of the negative voltage line NVSS, as discussed in the embodiments of FIG. 4.

In conclusion, the present disclosure provides a memory device that includes the switch circuit 125 to connect one or more than one capacitors to the negative voltage line NVSS used for the NBL scheme. Accordingly, the memory device can operate in different modes and dynamically regulate the loading of the negative voltage line NVSS by coupling various number of capacitors with the negative voltage line NVSS for different operational requirements. Moreover, as the flexibility of disconnecting redundant capacitors from the negative voltage line NVSS is provided for some application (e.g., fast speed demanding memory case), the kick efficiency is improved and the better power consumption is achieved due to the decreased loading of the negative voltage line NVSS.

In some embodiments, a memory device is provided, including at least one bit cell, a pair of transistors, and a voltage generation circuit. The at least one bit cell is coupled to a least one of multiple data lines. First terminals of the transistors are coupled to the pair of data lines respectively. Second terminals of the pair of transistors are coupled to a negative voltage line. The voltage generation circuit is coupled to the negative voltage line and is configured to pull down a voltage of the at least one of the data lines to a negative voltage level through the negative voltage line. The voltage generation circuit includes a first capacitive unit, a second capacitive unit, and a switch circuit. The first capacitive unit includes a first capacitor. The second capacitive unit includes a second capacitor. The switch circuit is coupled between the first capacitive unit and the negative voltage line and between the second capacitive unit and the negative voltage line, and is configured to connect the first capacitor, the second capacitor, or the combination thereof to the negative voltage line in response to a first kick signal and a second kick signal that are different from each other.

In some embodiments, the first capacitive unit further includes a first OR gate that is coupled to the first capacitor and configured to generate a first voltage signal to the first capacitor in response to an inverted enable signal and the first kick signal.

In some embodiments, a first terminal of the first capacitor is configured to receive the first voltage signal from the first OR gate, a second terminal of the first capacitor is coupled to the switch circuit at a node, and the first capacitor is configured to pull down a voltage level at the node in response to the first voltage signal.

In some embodiments, the switch circuit includes a first transistor, a first terminal of the first transistor being coupled to the negative voltage line, a second terminal of the first transistor being coupled to the first capacitor, wherein the first transistor is configured to be turned on to connect the first capacitor to the negative voltage line in response to the first kick signal.

In some embodiments, the switch circuit is further configured to connect the first capacitor to the negative voltage line in response to the first kick signal having a first logic value, and disconnect the second capacitor from the negative voltage line in response to the second kick signal having a second logic value different from the first logic value.

In some embodiments, a capacitance of the first capacitor is larger than a capacitance of the second capacitor.

In some embodiments, the at least one bit cell includes a first bit cell and a second bit cell, the data lines includes a first data line and a second data line, the first bit cell is arranged in a first bank and coupled to the first data line, the second bit cell is arranged in a second bank and coupled to the second data line, and the second bank is arranged between the first bank and the voltage generation circuit.

The switch circuit is further configured to connect the first and second capacitors to the negative voltage line to perform a write operation to the first bit cell through the first data line.

In some embodiments, the at least one bit cell includes a first bit cell and a second bit cell, the data lines comprise a first data line and a second data line, the first bit cell is arranged in a first bank and coupled to the first data line, the second bit cell is arranged in a second bank and coupled to the second data line, and the second bank is arranged between the first bank and the voltage generation circuit. The switch circuit is further configured to connect the first capacitor to the negative voltage line, to perform a write operation to the second bit cell through the second data line.

A method is provided, including: at least one of: increasing a capacitance of an electric path including a negative voltage line, by coupling a first terminal of a first capacitor to the negative voltage line in response to a first kick signal; or increasing the capacitance of the electric path, by coupling a first terminal of a second capacitor to the negative voltage line in response to a second kick signal different from the first kick signal; and pulling down, by the first capacitor, the second capacitor, or the combination thereof, a voltage of the negative voltage line to a negative voltage level in response to a first enable signal, the first kick signal, and the second kick signal. The negative voltage line is coupled between a driver circuit and a first terminal of a transistor, the driver circuit is coupled to a memory array, and a second terminal of the transistor is coupled to a ground voltage.

In some embodiments, increasing the capacitance of the electric path by coupling the first terminal of the first capacitor to the negative voltage line includes: turning on a first transistor coupled between the first capacitor and the negative voltage line in response to the first kick signal.

In some embodiments, the first capacitance of the first capacitor is different from the second capacitance of the second capacitor.

In some embodiments, the first capacitance of the first capacitor is larger than the second capacitance of the second capacitor.

In some embodiments, the method further includes: generating a first voltage signal in response to the first enable signal and the first kick signal and transmitting the first voltage signal to a second terminal of the first capacitor.

In some embodiments, the method further includes: controlling a voltage level of the first voltage signal to decrease by a voltage difference in response to the first enable signal, wherein the voltage difference is associated with the negative voltage level of the negative voltage line.

A memory device is provided, including a driver circuit, a first capacitive unit, a first switch circuit, a second capacitive unit, and a second switch circuit. The first switch circuit is coupled between the first capacitive unit and a negative voltage line coupled to the driver circuit and includes a first transistor. The first transistor is configured to be turned on in response to a first signal to connect the first capacitive unit to the negative voltage line to adjust a voltage level of the negative voltage line. The second switch circuit is coupled between the second capacitive unit and the negative voltage line and comprises a second transistor. The second transistor is configured to be turned on in response to a second signal different from the first signal to connect the second capacitive unit to the negative voltage line to adjust the voltage level of the negative voltage line.

In some embodiments, the first switch circuit further includes a third transistor, a first terminal of the third transistor is coupled to the first transistor, a second terminal of the third transistor is coupled to a ground voltage, and a control terminal of the third transistor is configured to receive a kick signal.

In some embodiments, the memory device further includes at least one third capacitive unit and at least one third switch circuit. The at least one third switch circuit is coupled between the at least one third capacitive unit and the negative voltage line. The first capacitive unit, the second capacitive unit, and the at least one third capacitive unit are coupled to an output terminal of an inverter. The at least one third switch circuit is configured to connect the at least one third capacitive unit to the negative voltage line in response to a third signal different from the first and second signals to adjust the voltage level of the negative voltage line.

In some embodiments, the first switch circuit further includes an inverter, and the inverter is configured to generate the first signal to the first transistor according to a kick signal.

In some embodiments, the first capacitive unit includes a capacitor and an OR gate. A first terminal of the capacitor is coupled to the first transistor. An output terminal of the OR gate is coupled to a second terminal of the capacitor, a first input terminal of the OR gate is configured to receive a kick signal, and a second input terminal of the OR gate is configured to receive an inverted enable signal.

In some embodiments, the memory device further includes a signal generation circuit. The signal generation circuit includes a first inverter and a second inverter. An input terminal of the first inverter receives a first enable signal, and an output terminal of the first inverter is coupled to the first capacitive unit. The first inverter is configured to generate a first kick signal in response to the first enable signal in a write operation. An input terminal of the second inverter receives a second enable signal different from the first enable signal, and an output terminal of the second inverter is coupled to the second capacitive unit. The second inverter is configured to generate a second kick signal in response to the second enable signal in the write operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   at least one bit cell coupled to at least one of a plurality of data lines;
   a pair of transistors, first terminals of the pair of transistors being coupled to the plurality of data lines respectively, second terminals of the pair of transistors being coupled to a negative voltage line; and
   a voltage generation circuit coupled to the negative voltage line and configured to pull down a voltage of the at least one of the plurality of data lines to a negative voltage level through the negative voltage line, the voltage generation circuit comprising:
   a first capacitive unit comprising a first capacitor;

a second capacitive unit comprising a second capacitor; and a switch circuit coupled between the first capacitive unit and the negative voltage line and between the second capacitive unit and the negative voltage line, and configured to connect the first capacitor, the second capacitor, or the combination thereof to the negative voltage line in response to a first kick signal and a second kick signal that are different from each other.

2. The memory device of claim 1, wherein the first capacitive unit further comprises a first OR gate that is coupled to the first capacitor and configured to generate a first voltage signal to the first capacitor in response to an inverted enable signal and the first kick signal.

3. The memory device of claim 2, wherein a first terminal of the first capacitor is configured to receive the first voltage signal from the first OR gate, a second terminal of the first capacitor is coupled to the switch circuit at a node, and the first capacitor is configured to pull down a voltage level at the node in response to the first voltage signal.

4. The memory device of claim 1, wherein the switch circuit comprises a first transistor, a first terminal of the first transistor being coupled to the negative voltage line, a second terminal of the first transistor being coupled to the first capacitor, wherein the first transistor is configured to be turned on to connect the first capacitor to the negative voltage line in response to the first kick signal.

5. The memory device of claim 1, wherein the switch circuit is further configured to connect the first capacitor to the negative voltage line in response to the first kick signal having a first logic value, and to disconnect the second capacitor from the negative voltage line in response to the second kick signal having a second logic value different from the first logic value.

6. The memory device of claim 1, wherein a capacitance of the first capacitor is larger than a capacitance of the second capacitor.

7. The memory device of claim 1, wherein the at least one bit cell comprises a first bit cell and a second bit cell, the plurality of data lines comprise a first data line and a second data line, the first bit cell is arranged in a first bank and coupled to the first data line, the second bit cell is arranged in a second bank and coupled to the second data line, and the second bank is arranged between the first bank and the voltage generation circuit; and the switch circuit is further configured to connect the first and second capacitors to the negative voltage line to perform a write operation to the first bit cell through the first data line.

8. The memory device of claim 1, wherein the at least one bit cell comprises a first bit cell and a second bit cell, the plurality of data lines comprise a first data line and a second data line, the first bit cell is arranged in a first bank and coupled to the first data line, the second bit cell is arranged in a second bank and coupled to the second data line, and the second bank is arranged between the first bank and the voltage generation circuit; and the switch circuit is further configured to connect the first capacitor to the negative voltage line, to perform a write operation to the second bit cell through the second data line.

9. A method, comprising:
at least one of:
increasing a capacitance of an electric path including a negative voltage line, by coupling a first terminal of a first capacitor to the negative voltage line in response to a first kick signal; or increasing the capacitance of the electric path, by coupling a first terminal of a second capacitor to the negative voltage line in response to a second kick signal different from the first kick signal; and pulling down, by the first capacitor, the second capacitor, or the combination thereof, a voltage of the negative voltage line to a negative voltage level in response to a first enable signal, the first kick signal, and the second kick signal;

wherein the negative voltage line is coupled between a driver circuit and a first terminal of a transistor, the driver circuit is coupled to a memory array, and a second terminal of the transistor is coupled to a ground voltage.

10. The method of claim 9, wherein increasing the capacitance of the electric path by coupling the first terminal of the first capacitor to the negative voltage line comprises:
turning on a first transistor coupled between the first capacitor and the negative voltage line in response to the first kick signal.

11. The method of claim 9, wherein a first capacitance of the first capacitor is different from a second capacitance of the second capacitor.

12. The method of claim 9, wherein a first capacitance of the first capacitor is larger than a second capacitance of the second capacitor.

13. The method of claim 9, further comprising:
generating a first voltage signal in response to the first enable signal and the first kick signal and transmitting the first voltage signal to a second terminal of the first capacitor.

14. The method of claim 13, further comprising:
controlling a voltage level of the first voltage signal to decrease by a voltage difference in response to the first enable signal, wherein the voltage difference is associated with the negative voltage level of the negative voltage line.

15. A memory device, comprising:
a driver circuit;
a first capacitive unit and a first switch circuit, wherein the first switch circuit is coupled between the first capacitive unit and a negative voltage line coupled to the driver circuit and comprises a first transistor;
wherein the first transistor is configured to be turned on in response to a first signal to connect the first capacitive unit to the negative voltage line to adjust a voltage level of the negative voltage line; and
a second capacitive unit and a second switch circuit, wherein the second switch circuit is coupled between the second capacitive unit and the negative voltage line and comprises a second transistor,
wherein the second transistor is configured to be turned on in response to a second signal different from the first signal to connect the second capacitive unit to the negative voltage line to adjust the voltage level of the negative voltage line.

16. The memory device of claim 15, wherein the first switch circuit further comprises a third transistor, a first terminal of the third transistor is coupled to the first transistor, a second terminal of the third transistor is coupled to a ground voltage, and a control terminal of the third transistor is configured to receive a kick signal.

17. The memory device of claim 15, further comprising:
at least one third capacitive unit and at least one third switch circuit, wherein the at least one third switch circuit is coupled between the at least one third capacitive unit and the negative voltage line;

wherein the first capacitive unit, the second capacitive unit, and the at least one third capacitive unit are coupled to an output terminal of an inverter;

wherein the at least one third switch circuit is configured to connect the at least one third capacitive unit to the negative voltage line in response to a third signal different from the first and second signals to adjust the voltage level of the negative voltage line.

18. The memory device of claim 15, wherein the first switch circuit further comprises an inverter, and the inverter is configured to generate the first signal to the first transistor according to a kick signal.

19. The memory device of claim 15, wherein the first capacitive unit comprises:
   a capacitor, a first terminal of the capacitor being coupled to the first transistor; and
   an OR gate, an output terminal of the OR gate being coupled to a second terminal of the capacitor, a first input terminal of the OR gate being configured to receive a kick signal, and a second input terminal of the OR gate being configured to receive an inverted enable signal.

20. The memory device of claim 15, further comprising:
   a signal generation circuit, the signal generation circuit comprising:
      a first inverter, an input terminal of the first inverter receiving a first enable signal, an output terminal of the first inverter being coupled to the first capacitive unit, wherein the first inverter is configured to generate a first kick signal in response to the first enable signal in a write operation; and
      a second inverter, an input terminal of the second inverter receiving a second enable signal different from the first enable signal, an output terminal of the second inverter being coupled to the second capacitive unit, wherein the second inverter is configured to generate a second kick signal in response to the second enable signal in the write operation.

* * * * *